United States Patent
Schott

(10) Patent No.: US 8,035,970 B2
(45) Date of Patent: Oct. 11, 2011

(54) REGULATION OF AIR FLOW THROUGH A COMPUTER BLADE CHASSIS USING MECHANICALLY ACTUATED VARIABLE AIR FLOW DAMPERS

(75) Inventor: Jared E. Schott, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 12/627,109

(22) Filed: Nov. 30, 2009

(65) Prior Publication Data

US 2011/0128697 A1    Jun. 2, 2011

(51) Int. Cl.
*H05K 7/20* (2006.01)

(52) U.S. Cl. ......................... 361/695; 361/694; 454/184

(58) Field of Classification Search .................. 361/695
See application file for complete search history.

(56) References Cited

U.S. PATENT DOCUMENTS

| | | |
|---|---|---|
| 3,680,470 A | 8/1972 | Neece |
| 5,528,455 A | 6/1996 | Miles |
| 6,047,836 A | 4/2000 | Miles |
| 6,058,011 A | 5/2000 | Hardt et al. |
| 6,542,363 B2 | 4/2003 | White |
| 6,688,965 B1 | 2/2004 | Crippen et al. |
| 6,771,499 B2 | 8/2004 | Crippen et al. |
| 7,075,788 B2 * | 7/2006 | Larson et al. ............... 361/695 |
| 7,344,439 B2 | 3/2008 | Henry et al. |
| 7,355,848 B1 * | 4/2008 | Hodge et al. ............... 361/690 |
| 7,549,917 B2 | 6/2009 | Henry et al. |
| 7,599,183 B2 * | 10/2009 | Dittus et al. ............... 361/695 |
| 7,646,601 B2 * | 1/2010 | Zhang et al. ............... 361/695 |
| 7,724,514 B2 * | 5/2010 | Peng et al. ............... 361/679.49 |
| 7,817,430 B2 * | 10/2010 | Sherrod et al. ............... 361/724 |
| 7,830,659 B2 * | 11/2010 | Liu et al. ............... 361/690 |
| 7,843,683 B2 * | 11/2010 | Suffern et al. ........... 361/679.46 |
| 2004/0100765 A1 | 5/2004 | Crippen et al. |
| 2009/0260795 A1 * | 10/2009 | Perazzo ........................ 165/269 |
| 2011/0053485 A1 * | 3/2011 | Huang et al. ............... 454/184 |

* cited by examiner

*Primary Examiner* — Gregory Thompson
(74) *Attorney, Agent, or Firm* — Cynthia G. Seal; Law Office of Jim Boice

(57) ABSTRACT

A server blade chassis having at least one mechanically actuated variable air flow damper is presented. One or more variable air flow dampers are aligned with server blades in the server blade chassis. When a server blade is pressed into a slot in the server blade chassis, one or more of the variable air flow dampers are mechanically opened, to variable degrees of movement, by the server blade pressing against the variable air flow dampers.

12 Claims, 9 Drawing Sheets

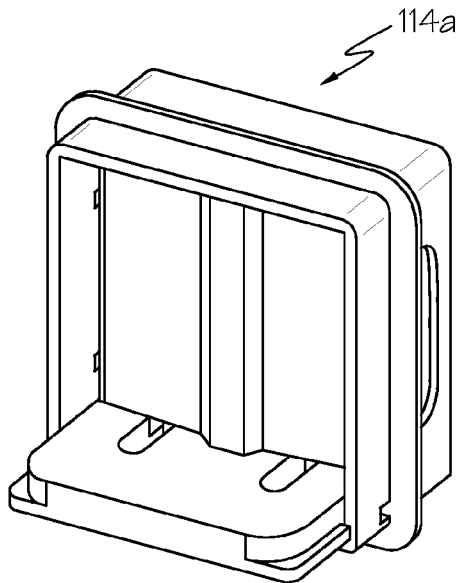 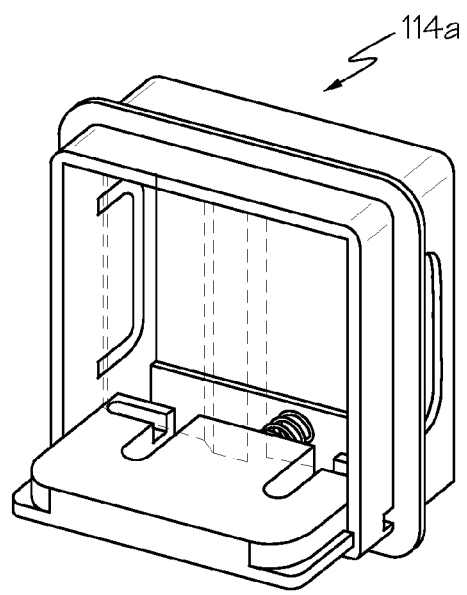
FIG. 2A            FIG. 2B
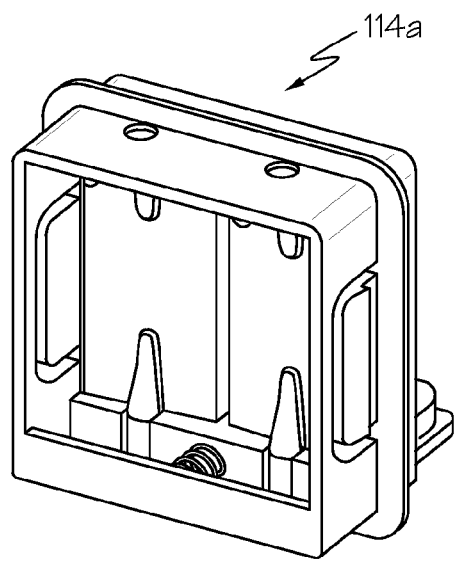
FIG. 2C

REGULATION OF AIR FLOW THROUGH A COMPUTER BLADE CHASSIS USING MECHANICALLY ACTUATED VARIABLE AIR FLOW DAMPERS

BACKGROUND

The present disclosure relates to the field of server blades, and specifically to server blade chassis. Still more particularly, the present disclosure relates to the regulation of air flow through a server blade chassis.

BRIEF SUMMARY

A server blade chassis having at least one mechanically actuated variable air flow damper is presented. One or more variable air flow dampers are aligned with server blades in the server blade chassis. When a server blade is pressed into a slot in the server blade chassis, one or more of the variable air flow dampers are mechanically opened, to variable degrees of movement, by the server blade pressing against the variable air flow dampers.

BRIEF DESCRIPTION OF THE SEVERAL VIEWS OF THE DRAWINGS

FIG. 1C depicts an exemplary blade chassis used with the presently described disclosure.

FIGS. 2A-2H illustrate various views of a mechanically actuated variable air flow damper in a closed position;

DETAILED DESCRIPTION

Figure 1B:
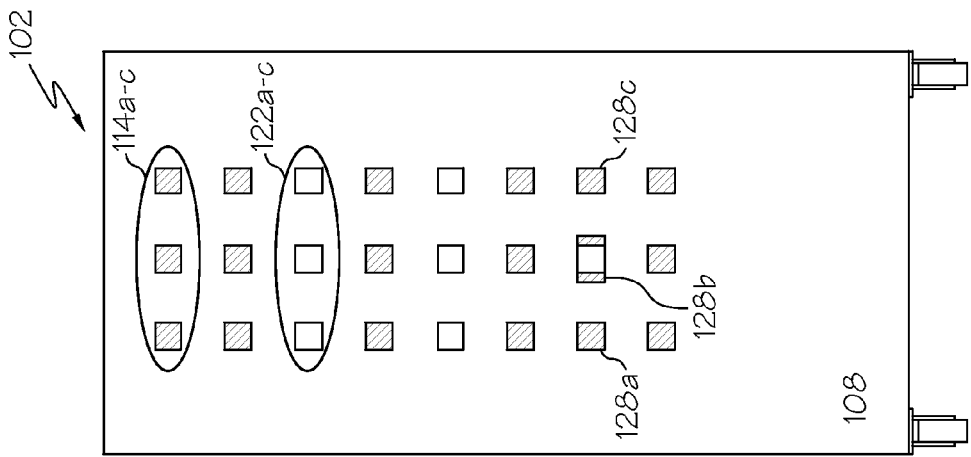
FIGS. 1A-1B depict an exemplary server blade chassis in which the presently described disclosure may be implemented.
Figure 1A:
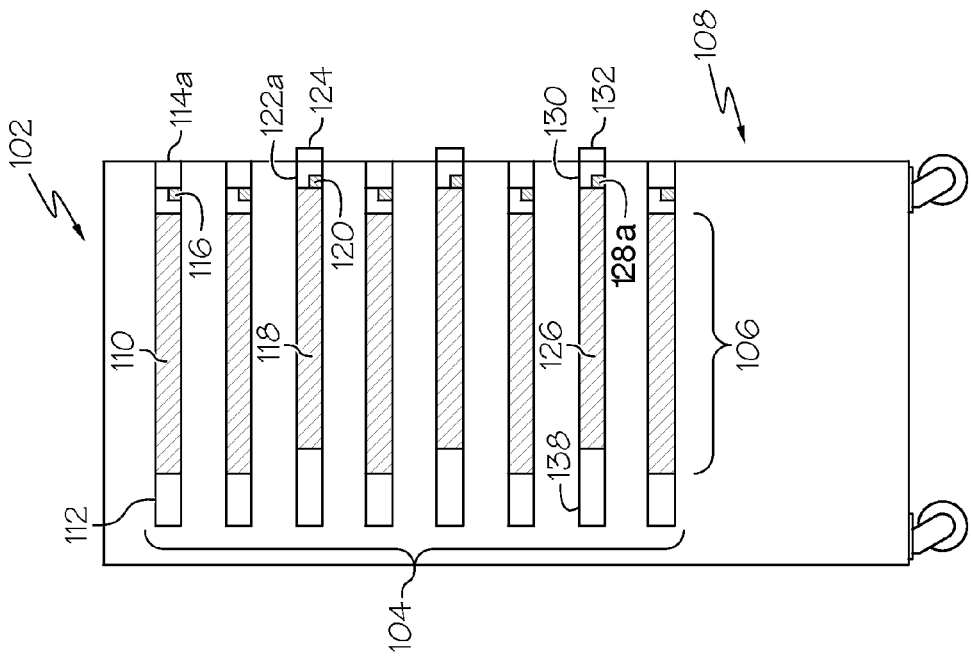

With reference now to the figures, and in particular to FIG. 1A, there is depicted a side view of an exemplary computer blade chassis 102 in which the presently described disclosure may be implemented. Mounted within computer blade chassis 102 are multiple slot tracks 104. Each slot track can support a single computer blade from computer blades 106. Each computer blade slides along channels (not shown) or ridges (also not shown) on the sides of the slot tracks 104, thus frictionally securing the computer blades 106. Each computer blade 106 is electrically connected to a socket (not shown). This connection can be made when the computer blade 106 is pressed all the way into the slot track (e.g., when the socket is fixedly mounted to the interior of planar board 108), or else can be made with a flexible cable having a terminating socket (also not shown) to which the computer blade can be electrically coupled.

Regardless of how a computer blade is electrically coupled, the present disclosure takes advantage of the ability of each computer blade to move in a linear manner on a slot track. For example, consider computer blade 110, which is roughly in the middle of slot track 112. Because of its relative positioning, computer blade 110 is not engaging (pressing against) a mechanically actuated variable air flow damper 114a. As will be described in more detail below, mechanically actuated variable air flow damper 114a comprises a mechanical actuator 116. Since computer blade 110 is not pressing against mechanical actuator 116, mechanically actuated variable air flow damper 114a remains fully closed.

With reference now to computer blade 118, note that computer blade 118 has pressed against and moved mechanical actuator 120 of mechanically actuated variable air flow damper 122a, causing damper doors 124 to fully open. Computer blade 126 is also pressing against, and thus moving, a mechanical actuator 128a of a mechanically actuated variable air flow damper 130. However, computer 126 has moved the mechanical actuator 128a a short distance (e.g., less than mechanical actuator 120 was moved), resulting in damper doors 132 only being partially opened.

With reference now to FIG. 1B, which presents a rear view of computer blade chassis 102, note that there are actually three mechanically actuated variable air flow dampers (114a-114c) that are in line with computer blade 110. All three mechanically actuated variable air flow dampers 114a-114c are closed. Similarly, there are actually three mechanically actuated variable air flow dampers 122a-122c that are in line with computer blade 118. All three mechanically actuated variable air flow dampers 122a-122c are wide open. Similarly, there are actually three mechanically actuated variable air flow dampers 128a-128c that are in line with computer blade 126. Note two different features about mechanically actuated variable air flow dampers 128a-128c. Mechanically actuated variable air flow dampers 128a and 128c are fully closed, while mechanically actuated variable air flow damper 128b is partially open. This variation is due to how mechanically actuated variable air flow dampers 128a-128c are physically mounted in and oriented within planar board 108. More specifically, mechanically actuated variable air flow dampers 128a and 128c are mounted so that they protrude farther out the back of planar board 108 that mechanically actuated variable air flow damper 128b. Thus, computer blade 126 is not pressing against the mechanical actuators of mechanically actuated variable air flow dampers 128a and 128c, but computer blade 126 is pressing against the mechanical actuator of mechanically actuated variable air flow damper 128b. In other words, by physically mounting various mechanically actuated variable air flow dampers such that each mechanically actuated variable air flow damper is positioned in a variable manner closer or more distal to a computer blade, each mechanically actuated variable air flow damper will be opened to greater or lesser degrees by movement of a computer blade. This permits a fine level of control over the amount of air flow that passes through the planar board 108, and thus around and across various computer blades 106.

Referring now to FIG. 1C, another embodiment of the present disclosure is presented, in which control of how much (if at all) mechanically actuated variable air flow dampers 128a-128c are opened is controlled by protrusions 140a-140c from a blade carrier 136. Consider again computer blade 126 shown in FIG. 1A. As depicted in FIG. 1C, computer blade 126 is coupled to blade carrier 136, which slides along a slot track 138 within the computer blade chassis 102 shown in FIG. 1A. Extended away from the rear of the blade carrier 136 are three protrusions 140a-140c. Note that protrusion 140b extends farther than protrusions 140a and 140c. Thus, when computer blade 126, riding on blade carrier 136, is pushed to the rear of slot track 138, protrusion 140b will press against the mechanical actuator (described below) of mechanically actuated variable air flow damper 128b, resulting in the damper doors 142 of mechanically actuated variable air flow damper 128b partially opening. At the same time, the damper doors (not shown) of mechanically actuated variable air flow dampers 128a and 128c remain closed. The length of any protrusion 140a-140c can be set, either fixedly or adjustably (using a sliding extension mechanism), at any distance, thus providing essentially unlimited control and variability as to how far any specific mechanically actuated variable air flow damper is open (if at all).

In another embodiment, the rear of blade carrier 136 does not have protrusions (e.g., 140a-140c), but rather indentations (not shown), such that an indentation results in a mechanical actuator not being engaged (or alternatively being engaged/pressed against to a lesser distance), while non-indented areas of the rear of blade carrier 136 fully engage (press against) the mechanical actuators of any mechanically actuated variable air flow damper with which they are aligned.

Note that other mechanically actuated variable air flow dampers (not labeled) for other computer blades (also not labeled) are illustrated. Note further that while each server blade is shown with three mechanically actuated variable air flow dampers in FIG. 1B, in other embodiments each computer blade can be aligned with as many or as few (including none) of the mechanically actuated variable air flow dampers and/or the openings in planar board 108 into which they are mounted, in accordance with the choice made by a designer of the cooling system for the computer blade chassis 102. Thus, each computer blade may have any number of mechanically actuated variable air flow dampers, and each of the mechanically actuated variable air flow dampers aligned with that computer blade may be physically oriented (anterior or posterior) in the planar board 108 such that each mechanically actuated variable air flow damper opens more or less according to how far that computer blade is pushed in.

Figure 2D:
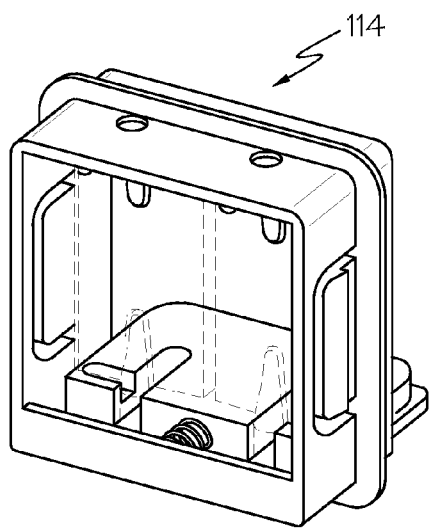
Figure 2E:
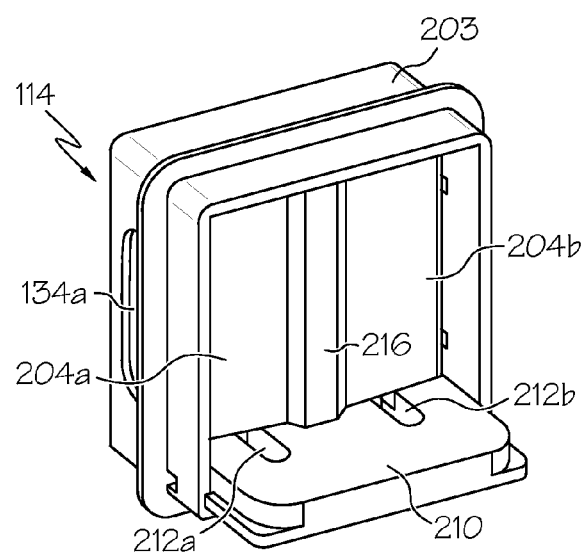
Figure 2F:
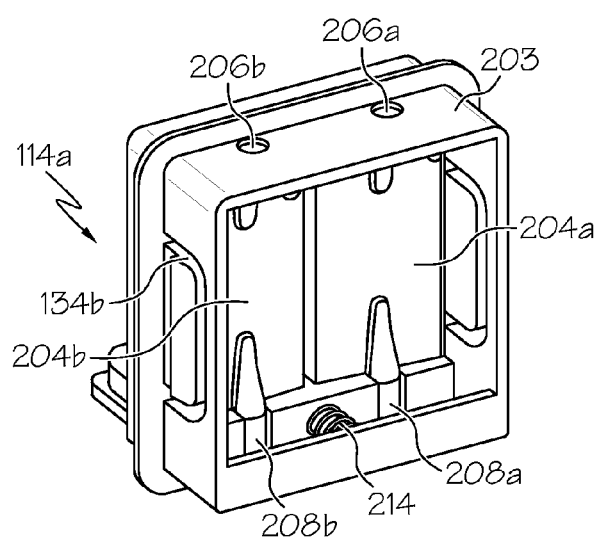
Figure 2G:
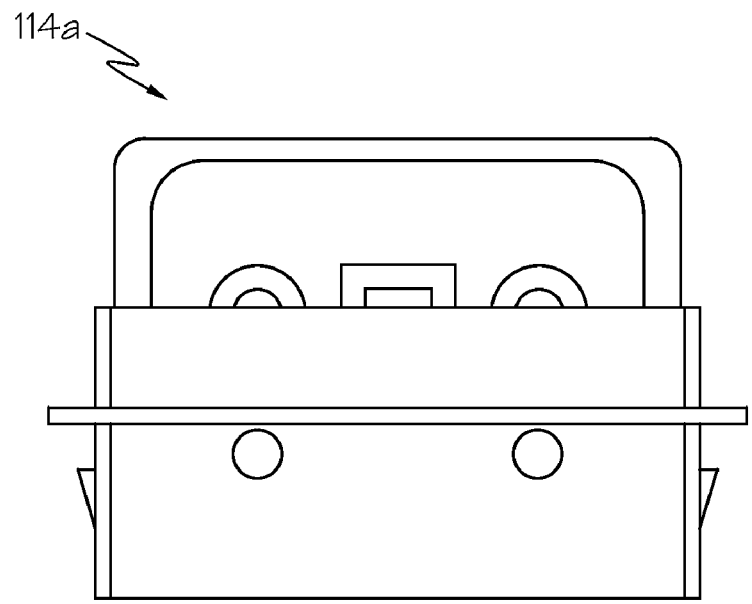

With reference now to FIGS. 2A-2H, various views of a closed mechanically actuated variable air flow damper (e.g., mechanically actuated variable air flow damper 114a depicted in FIG. 1A) are presented. FIGS. 2A-2B and 2E present a front view (as seen if looking from inside the computer chassis) of the closed mechanically actuated variable air flow damper, FIGS. 2C-2D and 2F present a rear view (as seen from looking at the back/exterior of planar board 108), and FIG. 2G (opaque) and 2H (cutaway) present a bottom view of the closed mechanically actuated variable air flow damper. Consider now FIG. 2E. Closed mechanically actuated variable air flow damper 114a has a first damper door 204a and a second damper door 204b. The first damper door 204a is rotatably mounted to damper housing 203 by a first upper rotating pin 206a and a first lower rotating pin 208a (as depicted in FIG. 2F). The second damper door 204b is rotatably mounted to damper housing 203 by a second upper rotating pin 206b and a second lower rotating pin 208b. When mechanical actuator 210 is moved (e.g., by being pressed against by computer blade 118 or computer blade 126 as described in FIG. 1), first lower rotating pin 208a slides along and within a first linear channel 212a. Similarly, second lower rotating pin 208b slides along and within a second linear channel 212b. Note that first linear channel 212a and second linear channel 212b are substantially parallel to one another.

Figure 2H:
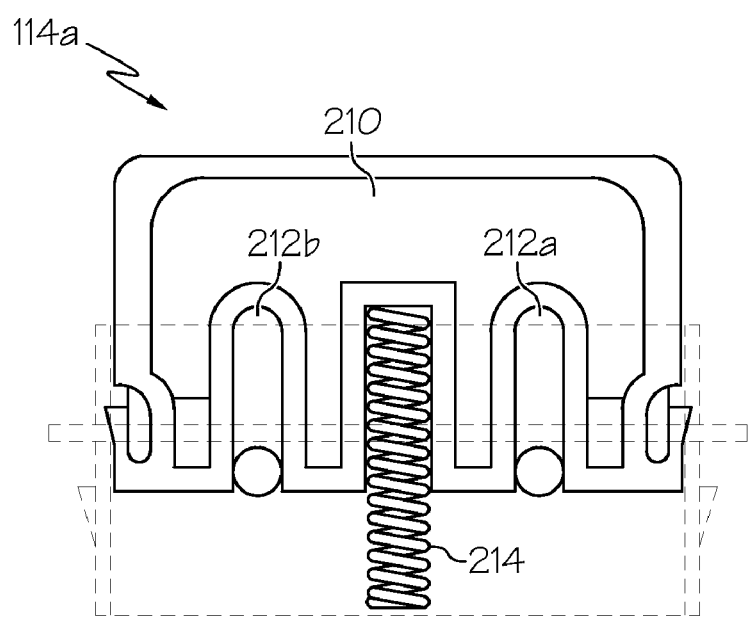

As shown in FIG. 2H, a compression spring 214 is oriented within mechanical actuator 210. Compression spring 214 causes mechanical actuator 210 to return to a closed position in which the first damper door 204a and the second damper door 204b are closed when the computer blade is moved (repositioned) such that it no longer presses against (touches) the mechanical actuator 210. Note that while mechanically actuated variable air flow damper 114a is in the closed position, a damper door sealing lip 216, which runs along the entire edge of (offset to and extending away from) second damper door 204b, such that the damper door sealing lip 216 creates an air seal between the first damper door 204a and the second damper door 204b when the first and second damper doors are in the closed position.

Note that a first clip 134a (as shown in FIG. 2E) and a second clip 134b (as shown in FIG. 2F), located within opposite sides of the damper housing 203, secure the damper housing 203 to an opening within the planar board (e.g., planar board 108 shown in FIGS. 1A-1B). However, the mechanically actuated variable air flow damper can be adjustably mounted within the planar board by other types of connectors, including toothed rack and pinion, friction secured slots, clamped slots, etc., such that the orientation of the mechanically actuated variable air flow damper is adjusted according to how much it should be opened for various positions of the computer blade (i.e., how far in the computer blade is pushed into its slot track).

Note that while mechanically actuated variable air flow damper 114a is depicted as having two damper doors (204a-204b), in another embodiment, mechanically actuated variable air flow damper 114a may have one, three, four or more damper doors, depending on the amount of airflow needed to pass through mechanically actuated variable air flow damper 114a in order to provide adequate ventilation for a particular computer blade, as well as depending on the amount of restricted or unrestricted air flow that is needed throughout the entire blade chassis. Similarly, the positioning and number of mechanically actuated variable air flow dampers may depend on the amount of ventilation needed for a particular computer blade, as well as the volume of restricted or unrestricted air flow that is needed throughout the entire blade chassis.

Figure 3A:
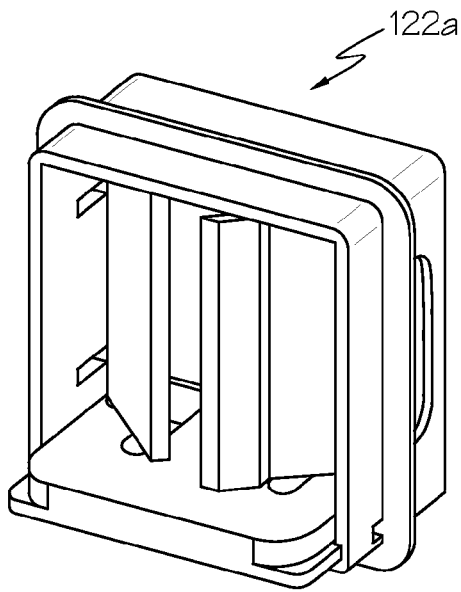
FIGS. 3A-3F depict various views of the mechanically actuated variable air flow damper in a partially opened position.
Figure 3B:
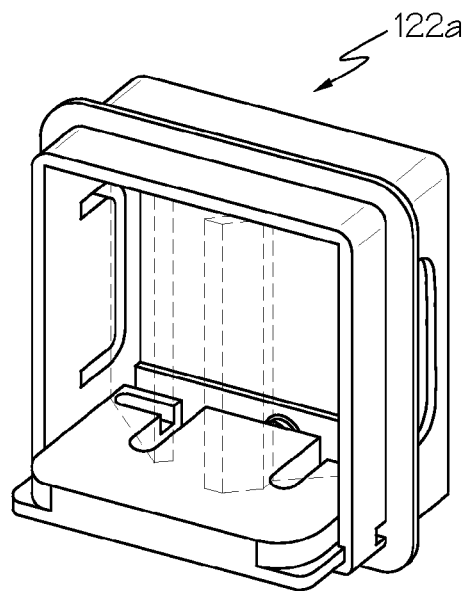
Figure 3C:
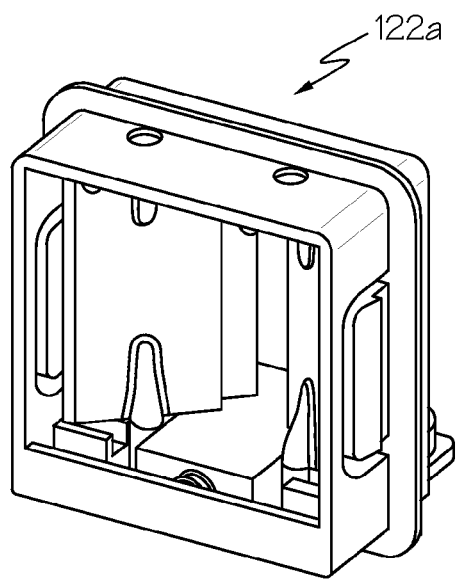
Figure 3D:
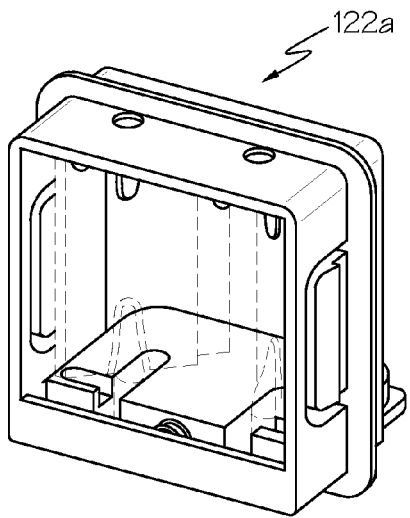
Figure 3E:
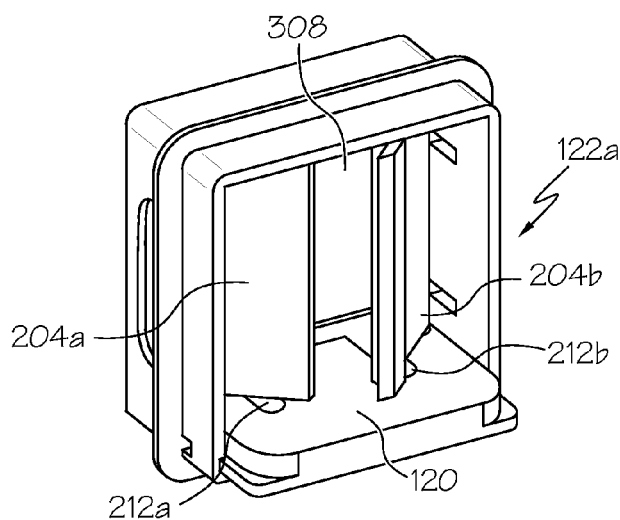
Figure 3F:
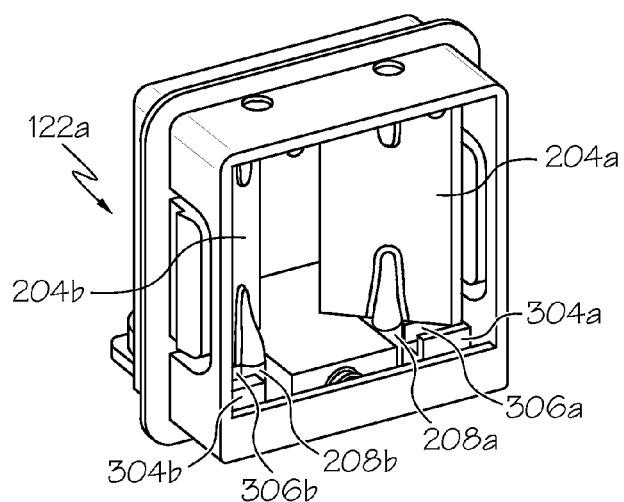
Figure 4A:
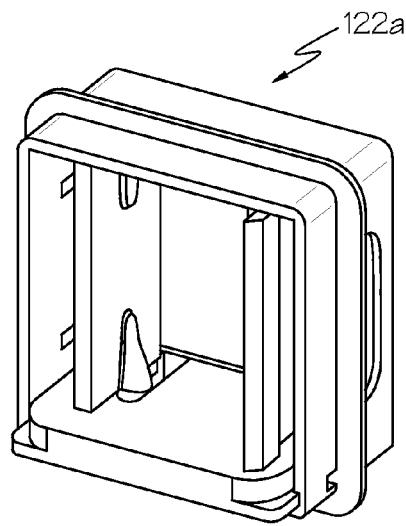
FIGS. 4A-4H illustrate various views of the mechanically actuated variable air flow damper in a wide open position.
Figure 4B:
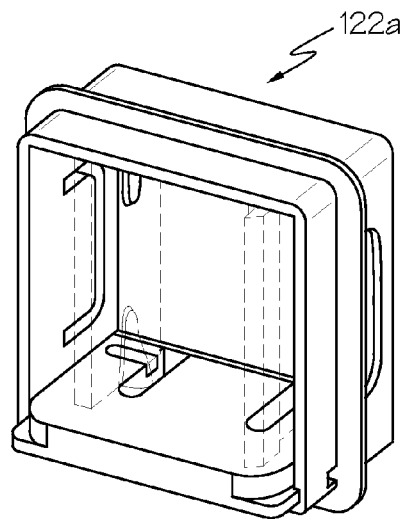
Figure 4C:
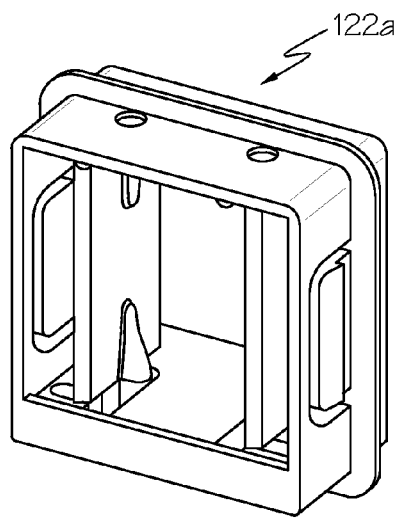
Figure 4D:
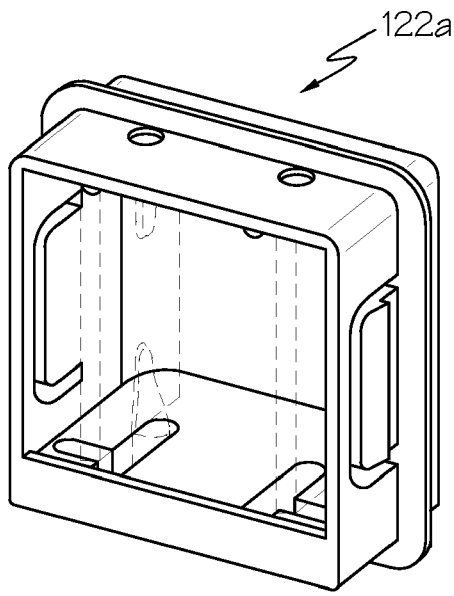
Figure 4E:
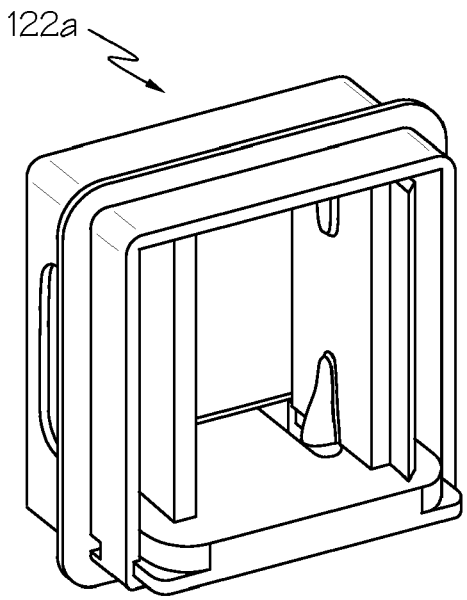
Figure 4F:
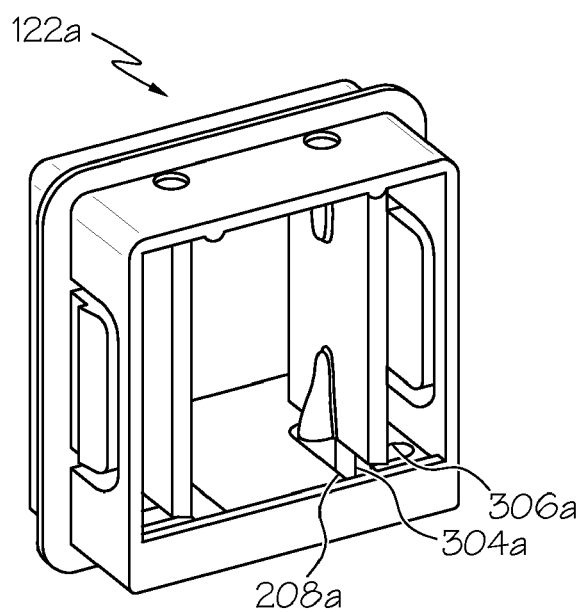
Figure 4G:
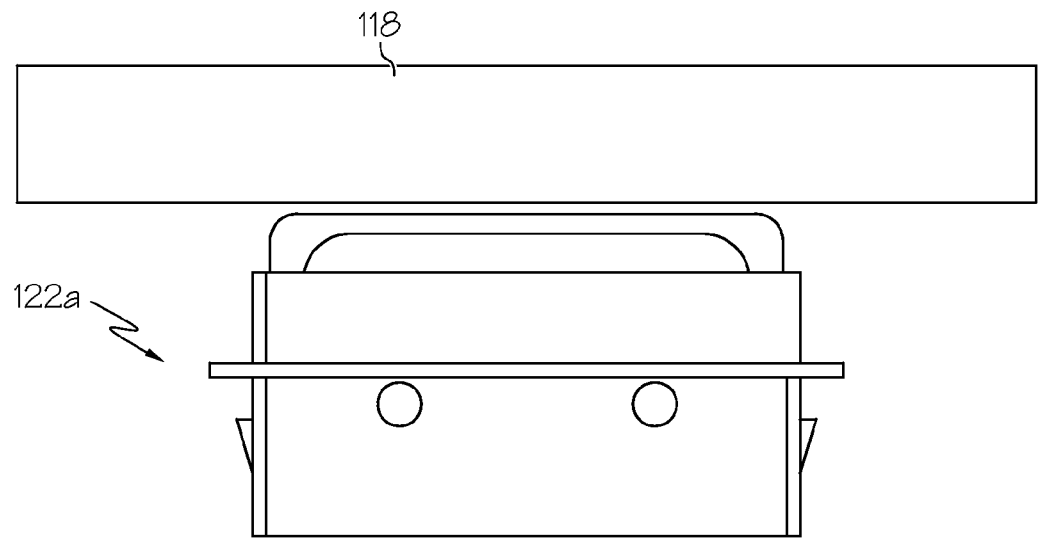
Figure 4H:
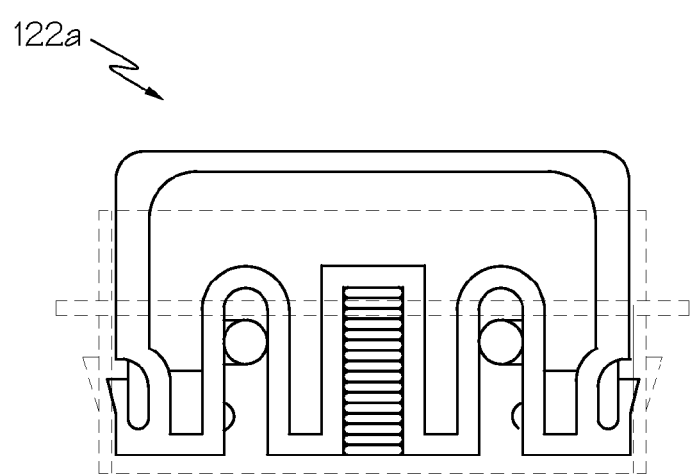

With reference now to FIGS. 3A-3F, similar views to FIGS. 2A-2F are presented, except that the mechanically actuated variable air flow damper (e.g., mechanically actuated variable air flow damper 122a shown in FIG. 1A) is now partially open. As depicted in FIG. 3F, a first sliding pin 304a extends away from the lower edge of the first damper door 204a, and a second sliding pin 304b extends away from the lower edge of the second damper door 204b. Note also that the first sliding pin 304a is medially offset to the first lower rotating pin 208a, and the second sliding pin 304b is likewise medially offset to the second lower rotating pin 208b. Thus, when the mechanical actuator 120 moves in a linear direction (e.g., by being pushed by computer blade 118 shown in FIG. 1A), first sliding pin 304a slides within a first transverse channel 306a (which extends away from the first linear channel 212a in a perpendicular direction). Similarly, second sliding pin 304b slides within a second transverse channel 306b (which extends away from the second linear channel 212b in a perpendicular direction). This movement causes the damper doors 204a-204b to rotate about their respective upper and lower rotating pins 206 and 208, resulting in a partial opening 308 (which can be viewed as a combination of the first and second openings created by the movement of the damper doors 204a-204b) of mechanically actuated variable air flow damper 122a.

With reference now to FIGS. 4A-4H, similar views to FIGS. 2A-2H are presented, except that the mechanically actuated variable air flow damper (e.g., mechanically actuated variable air flow damper 122a shown in FIG. 1A) is now fully open. Thus, mechanically actuated variable air flow dampers as described herein may be closed (FIGS. 2A-2H), fully open (FIGS. 4A-4H), or partially open (FIGS. 3A-3F) at any desired degree.

The novel mechanically actuated variable air flow dampers described herein maintain proper system cooling when server nodes (e.g., computer blades) are added and/or removed from a chassis, thus preventing the short-circuiting of air flow that would otherwise reduce or eliminate the cooling to remaining nodes. These mechanically actuated variable air flow dampers also regulate the impendence of individual nodes based on their respective cooling requirements to achieve optimum operational parameters and better energy efficiency. Air flow is regulated to pass through the back planar board via air openings located near the exhaust of the nodes in a highly controlled and variable manner, while maintaining a sealed closure when so desired. Thus, the described mechanically actuated variable air flow dampers provide for 1) variable impedance, 2) less air leakage in closed state, and are 3) immune to unintended actuation caused by pressure effects.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described embodiments of the invention of the present application in detail and by reference to illustrative embodiments thereof, it will be apparent that modifications and variations are possible without departing from the scope of the invention defined in the appended claims.

What is claimed is:

1. A computer blade chassis comprising:
    a planar board;
    a separate slot track for supporting each of one or more computer blades in the computer blade chassis; and
    at least one mechanically actuated variable air flow damper mounted in the planar board, wherein the mechanically actuated variable air flow damper is mounted in a substantially same plane as one of said one or more computer blades, and wherein the mechanically actuated variable air flow damper comprises:
        a damper housing comprising a damper housing interior;
        a mechanical actuator slidably mounted at one end of the interior of the damper housing;
    a first damper door and a second damper door, wherein the first damper door is rotatably mounted to the damper housing by a first upper rotating pin and a first lower rotating, pin, wherein the second damper door is rotatably mounted to the damper housing by a second upper rotating pin and a second lower rotating pin;
    a first linear channel in the mechanical actuator, wherein the first lower rotating pin slides along the first linear channel when said one of said one or more computer blades presses against the mechanical actuator in a planar direction;
    a second linear channel in the mechanical actuator, wherein the second lower rotating pin slides along the second linear channel when said one of said one or more computer blades presses against the mechanical actuator in the planar direction, and wherein the first and second linear channels are substantially parallel to one another;
    a first transverse channel extending away from the first linear channel in a perpendicular direction;
    a second transverse channel extending away from the second linear channel in the perpendicular direction;
    a first sliding pin extending from a lower edge of the first damper door, wherein the first sliding pin is medially offset to the first lower rotating pin, and wherein the first sliding pin slides within the first transverse channel to force the first damper door to rotate and create a first opening through the interior of the damper housing when said one of said one or more computer blades presses against the mechanical actuator in the planar direction; and
    a second sliding pin extending from a lower edge of the second damper door, wherein the second sliding pin is medially offset to the second lower rotating pin, and wherein the second sliding pin slides within the second transverse channel to force the second damper door to rotate and create a second opening through the interior of the damper housing when said one of said one or more computer blades presses against the mechanical actuator in the planar direction.

2. The computer blade chassis of claim further comprising:
    a compression spring, oriented within the mechanical actuator, wherein the compression spring causes the mechanical actuator to return to a closed position in which the first and second damper doors are closed when said one of said one or more computer blades is moved to no longer touch the mechanical actuator.

3. The computer blade chassis of claim 2, further comprising;
    a damper door sealing lip offset to and extending away from an edge of the second damper door, wherein the damper door sealing lip creates an air seal between the first damper door and the second damper door when the first and second damper doors are in the closed position.

4. The computer blade chassis of claim 3, wherein the mechanical actuator composes a first clip and a second clip located within opposite sides of the damper housing, and wherein the first and second clips secure the damper housing to an opening within the planar board.

5. The computer blade chassis of claim 1, wherein a slot track for said one of said one or more computer blades permits multiple linear positioning of said one of said one or more computer blades, wherein the multiple linear positioning causes the mechanical actuator to move different distances during engagement with said one of said one or more computer blades, and wherein the different distances cause the mechanically actuated variable air flow damper to open wider as said one of said one or more computer blades is pressed farther against the mechanical actuator.

6. The computer blade chassis of claim 1, wherein said one of said one or more computer blades within the computer blade chassis is aligned with multiple mechanically actuated variable air flow dampers, and wherein said one of said one or more computer blades is supported on a slot track in the computer blade chassis.

7. The computer blade chassis of claim 1, wherein at least two mechanically actuated variable air flow dampers are positioned within the planar board at different distances from one of said one or more computer blades, wherein the one of said one or more computer blades contacts mechanical actuators of the at least two mechanically actuated variable air flow dampers at different sliding positions of one of said one or more computer blades, and wherein the at least two mechanically actuated variable air flow dampers are opened and closed by different degrees of orientation as one of said one or more computer blades slides along its separate slot track.

8. The computer blade chassis of claim further comprising:
- a blade carrier, wherein the blade carrier holds one of said one or more computer blades, and wherein the blade carrier travels on said separate slot track; and
- at least one protrusion extending from a rear of the blade carrier, wherein said at least one protrusion presses against the mechanical actuator to open the mechanically actuated variable air flow damper, and wherein said at least one protrusion is configured in accordance with an airflow requirement for one of said one or computer blades.

9. A mechanically actuated variable as flow damper comprising:
- a damper housing comprising a damper housing interior;
- a mechanical actuator slidably mounted at one end of the interior of the damper housing;
- a first damper door and a second damper door, wherein the first damper door is rotatably mounted to the damper housing by a first upper rotating pin and a first lower rotating pin, wherein the second damper door is rotatably mounted to the damper housing, by a second upper rotating in and a second lower rotating pin;
- a first linear channel in the mechanical actuator, wherein the first lower rotating pin slides along the first linear channel when a computer blade presses against the mechanical actuator in a planar direction;
- a second linear channel in the mechanical actuator, wherein the second lower rotating pin slides along the second linear channel when the computer blade presses against the mechanical actuator in the planar direction, and wherein the first and second linear channels are substantially, parallel to one another;
- a first transverse channel extending away from the first linear channel in a perpendicular direction;
- a second transverse channel extending away from the second linear channel in the perpendicular direction;
- a first sliding pin extending from a lower edge of the first damper door, wherein the first sliding pin is medially offset to the first lower rotating, pin, and wherein the first sliding pin slides within the first transverse channel to force the first damper door to rotate and create a first opening through the interior of the damper housing when the computer blade presses against the mechanical actuator in the planar direction; and
- a second sliding pin extending from a lower edge of the second damper door, wherein the second sliding pin is medially offset to the second lower rotating pin, and wherein the second sliding pin slides within the second transverse channel to force the second damper door to rotate and create a second opening through the interior of the damper housing when the computer blade presses against the mechanical actuator in the planar direction.

10. The mechanically actuated variable air flow damper of claim 9, further comprising:
- a compression spring oriented within the mechanical actuator, wherein the compression spring causes the mechanical actuator to return to a closed position in which the first and second damper doors are closed when the computer blade is moved to no longer touch the mechanical actuator.

11. The mechanically actuated variable air flow damper of claim 10, further comprising:
- a damper door sealing lip offset to and extending away from an edge of the second damper door, wherein the damper door sealing lip creates an air seal between the first damper door and the second damper door when the first and second damper doors are in the closed position.

12. The mechanically actuated variable air flow damper of claim 11, wherein the mechanical actuator comprises a first clip and a second clip located within opposite sides of the damper housing, and wherein the first and second clips secure the damper housing to an opening within a planar board on which the mechanically actuated variable air flow damper is mounted.

* * * * *